(12) United States Patent
Peperhowe et al.

(10) Patent No.: US 10,204,190 B2
(45) Date of Patent: Feb. 12, 2019

(54) CALCULATING A DESIRED TRAJECTORY

(71) Applicant: dSPACE digital signal processing and control engineering GmbH, Paderborn (DE)

(72) Inventors: Michael Peperhowe, Ruethen (DE); Kusnadi Liem, Paderborn (DE)

(73) Assignee: dSPACE digital signal processing and control engineering, Paderborn (DE)

( * ) Notice: Subject to any disclaimer, the term of this patent is extended or adjusted under 35 U.S.C. 154(b) by 202 days.

(21) Appl. No.: 15/234,403

(22) Filed: Aug. 11, 2016

(65) Prior Publication Data
US 2017/0045418 A1 Feb. 16, 2017

(30) Foreign Application Priority Data
Aug. 11, 2015 (DE) .................. 10 2015 010 167

(51) Int. Cl.
| | | |
|---|---|---|
| B60W 30/10 | (2006.01) | |
| B60W 50/00 | (2006.01) | |
| G06F 17/50 | (2006.01) | |
| B60W 30/18 | (2012.01) | |

(52) U.S. Cl.
CPC ......... *G06F 17/5009* (2013.01); *B60W 30/10* (2013.01); *B60W 50/00* (2013.01); *B60W 30/18145* (2013.01); *B60W 2050/0028* (2013.01); *B60W 2050/0031* (2013.01); *B60W 2420/42* (2013.01)

(58) Field of Classification Search
CPC .............. G06F 17/5009; B60W 30/10; B60W 30/18145; B60W 50/10; B60W 2050/0028; B60W 2050/0031; B60W 2420/42
See application file for complete search history.

(56) References Cited

U.S. PATENT DOCUMENTS

2005/0273299 A1* 12/2005 Toyosawa ........... G06F 17/5009
703/7
2016/0055274 A1* 2/2016 Kapalko ................. G06F 17/16
703/2

OTHER PUBLICATIONS

U.S. Appl. No. 15/151,767, filed May 11, 2016, Sauer et al.
(Continued)

*Primary Examiner* — Manuel L Barbee
(74) *Attorney, Agent, or Firm* — Muncy, Geissler, Olds & Lowe, P.C.

(57) ABSTRACT

A method for calculating a desired trajectory for a vehicle is provided. The vehicle is located at a position on a road bounded by two road edges, wherein the road edges are known at least in a region around the position of the vehicle. A spring-mass model is introduced, wherein the spring-mass model is used for calculating the desired trajectory, wherein the positions of the point masses are calculated for a rest state of the spring-mass model, and the calculated positions of the point masses are used as data points for the calculation of a curve connecting the point masses, whereby the curve represents the desired trajectory.

14 Claims, 8 Drawing Sheets

(56) References Cited

OTHER PUBLICATIONS

Rowe et al., "A springs and masses model for determining the lowest risk path in a threat environment," Anziam J., vol. 50, pp. C1066-C1079 (2010).
Braghin et al., "Race driver model," Computers and Structures, vol. 86, pp. 1503-1516 (2008).
Bart van de Poel, "Raceline Optimization," BA Thesis of University of Amsterdam, pp. 1-24.
Xu et al., "A Real-Time Motion Planner with Trajectory Optimization for Autonomous Vehicles," IEEE Int'l Conf. on Robotics & Automation, pp. 2061-2067 (May 2012).

* cited by examiner

CALCULATING A DESIRED TRAJECTORY

This nonprovisional application claims priority under 35 U.S.C. § 119(a) to German Patent Application No. 10 2015 010 167.6, which was filed in Germany on Aug. 11, 2015, and which is herein incorporated by reference.

BACKGROUND OF THE INVENTION

Field of the Invention

The invention relates to a method for calculating a desired trajectory of a vehicle.

Description of the Background Art

Algorithms for automatic steering of vehicles are employed in various areas of the automotive industry, for example for steering autonomous vehicles or as part of simulations in developing software for vehicle control units. Algorithms of this type include control algorithms for adjusting the travel trajectory of the vehicle to a desired trajectory.

From "A springs and masses model for determining the lowest risk path in a threat environment," by M. P. Rowe et al., ANZIAM J. 50, pages C1066-C1079, 2010, a method is known that calculates a trajectory through a danger area with a minimized risk by means of a spring-mass model. To this end, a starting point and a destination point are produced through a chain of multiple successive point masses connected with translational spring elements, and the threat locations are taken into account as repulsive forces on the point masses.

The calculation of a time-optimized trajectory for a road course known in advance is known from "Race driver model," by F. Braghin et al., Computers and Structures, vol. 86, pages 1503-1516, 2008. The final time-optimized trajectory results from a weighting of a trajectory minimized with regard to curvature that permits the highest possible speed, and a trajectory minimized with regard to length for the shortest possible total path.

SUMMARY OF THE INVENTION

It is therefore an object of the invention to provide a method that advances the state of the art.

According an exemplary embodiment of the invention, a method for calculating a desired trajectory of a vehicle provides a spring-mass model and uses it to calculate the desired trajectory, wherein positions of point masses of the spring-mass model are calculated for a rest state of the spring-mass model, wherein the calculated positions of the point masses are used as data points for the calculation of a curve connecting the point masses, or at least a part of a curve connecting the point masses, and wherein the curve represents the desired trajectory. The vehicle can be located at a position on a road bounded by two road edges, wherein the road edges are known at least in a region around the position of the vehicle. The spring-mass model has at least three point masses, wherein each point mass has a position on the road and the positions of the point masses represent data points of the desired trajectory, and wherein each point mass is movable along a guideway, and wherein each guideway is perpendicular to a road center line running centered between the road edges and extends from one road edge to the other road edge, wherein the guideways have a predefined spacing along the road center line from one another, wherein the guideways each have a predefined spacing along the road center line from a straight line that passes through the position of the vehicle and is perpendicular to the road center line, wherein every pair of directly adjacent point masses is connected by a translational longitudinal spring element with an attractive spring force acting in a direction that connects the two point masses, wherein every set of three directly sequential point masses forms a unit has a preceding point mass, a middle point mass, and a subsequent point mass, wherein the point masses of each unit are connected by a rotational spring element with a spring force that exerts a torque, wherein a center of rotation of the rotational spring element coincides with the position of the middle point mass, wherein the spring force of the rotational spring element is a function of an angle between a first straight line connecting the middle point mass with the preceding point mass and a second straight line connecting the middle point mass with the subsequent point mass, and has a zero point for a value of the angle of 180°, and wherein the spring-mass model has a rest state at a speed $v_M=0$ and an acceleration $a_M=0$ for all point masses, wherein the spring-mass model is used for calculating the desired trajectory, and wherein the positions of the point masses are calculated for the rest state of the spring-mass model, and wherein the calculated positions of at least a portion of the point masses are used as data points for the calculation of a curve connecting the point masses, and wherein the curve represents the desired trajectory.

It is a matter of course that the term road or edge of the road can also be understood to mean a lane with edges. For example, a road can also include a lane or multiple lanes, wherein the lanes can also be traveled in opposite directions.

The desired trajectory can specify a line that should ideally be traveled for time-optimized coverage of a route section of the road. A minimum-distance shape of the trajectory can be sought by means of the coupling of adjacent point masses by means of translational spring elements, while the coupling by means of rotational spring elements aims at a minimum-curvature shape. A weighting between minimization of distance and minimization of curvature is achieved through the ratio of the stiffnesses, which is to say the size of the spring constants, of the translational spring elements in relation to the stiffnesses, which is to say in relation to the size of the spring constants, of the rotational spring elements.

By means of the selection and combination of the stiffnesses of the translational longitudinal spring elements and the rotational spring elements, it is possible to achieve different driver types or the trajectories sought by different driver types as the desired trajectory. For example, a corner-cutting desired trajectory that corresponds to an offensive driving style is achieved through stiff torsion springs and stiff longitudinal springs. A professional driving style aimed solely at time optimization, or a desired trajectory corresponding thereto, can be achieved through a combination of stiff torsion springs and relatively weak longitudinal springs.

An advantage of the method according to the invention is that the desired trajectory is not calculated as part of a pre-processing before a simulation, but instead during the run time of the simulation itself. The calculation of the desired trajectory in real time is possible in particular because only one local route shape in the region of the position of the vehicle is taken into account at a time. Furthermore, it is possible to take route changes into account or to travel a route that is not known in advance. Prior knowledge of the shape of the entire route is not necessary.

In an embodiment, for a moving vehicle the position of the vehicle can be determined at different times and the desired trajectory can be calculated each time. In an embodiment, the position of the vehicle can be determined at time intervals less than or equal to 1 ms and the desired trajectory can be calculated each time. In this way, the spring-mass model is moved along with the vehicle, ensuring that the desired trajectory always takes into account the current position of the vehicle and the route section of the road located ahead of the current position. Furthermore, it is ensured that changes in the road are taken into account in real time.

According to an embodiment, the positions of the point masses calculated at a first time are used as initial values for calculating the positions of the point masses at a second time.

According to an embodiment, a portion of the point masses, in particular a majority of the point masses, can be located ahead of the position of the vehicle with regard to a direction of travel, wherein the rest of the point masses are located behind the position of the vehicle with regard to the direction of travel. While the point masses located ahead of the vehicle in the direction of travel indicate the route that should ideally be traveled, the point masses located behind the vehicle in the direction of travel help to stabilize over time the shape of the curve connecting at least a portion of the point masses.

In an embodiment, the rest state can be determined by means of a numerical method of root finding, for example a Newton method or nested intervals.

In an embodiment, each point mass can be connected to one of the road edges, or to a line parallel to a road edge or to the road center line, by at least one translational transverse spring element with a spring force acting perpendicularly to the road center line. The additional couplings of the individual point masses to the road edge by means of additional translational springs, which is to say the transverse spring elements, ensures that the optimized shape of the route, which is to say the desired trajectory, maintains an adequate spacing from the road edge. By means of a large spring force of the transverse spring elements it is possible to simulate a trajectory of a careful driver, wherein the driver endeavors to drive in the middle of the road as much as possible. A weak spring force of the transverse spring elements, or a spring force that only acts at very short spacings from the road edge, ensures that the vehicle remains on the road while at the same time permitting a driving style that is considerably more aggressive or aimed at time optimization.

According to an embodiment, the spring force of the translational transverse spring element can have a nonlinear characteristic curve. To ensure a sufficient spacing from the road edges on the one hand, and low impairment of the motion of the point masses within a central region of the road on the other hand, the characteristic curve of the spring force is designed such that the spring force does not increase significantly until the spacing falls below a minimum spacing from the road edges.

In an embodiment, the vehicle and the road can be virtual. In an alternative embodiment, the vehicle is real and the road edges are detected by, for example, a camera system or other sensors known to one skilled in the art.

According to an embodiment, the spacing between each pair of directly adjacent guideways along the road center line is a function of the speed of the vehicle. In an embodiment, the size of the spring force, which is to say the stiffness of the translational longitudinal spring elements, additionally is inversely proportional to the spacing between two directly adjacent guideways. As a result of an increasing spacing of the guideways, an overall length of the desired trajectory is increased. A weakening of the spring force compensates for the increasing deflection of the translational longitudinal spring elements caused by the increase in spacing.

In an embodiment, the desired trajectory is calculated as part of a hardware-in-the-loop simulation. In connection with the invention, a hardware-in-the-loop simulation is to be understood in particular to mean that an embedded system, for example an electronic control unit or a mechatronic component, is connected through its data inputs and data outputs to a simulation computer, wherein the simulation computer is configured to simulate the real environment of the embedded system in hard real time. Hard real time is understood in particular to mean that the calculations for the desired trajectory are completed in a time period of less than 1 ms.

The curve that connects at least a portion of the point masses is defined in an embodiment in the form of a continuous analytic expression, in particular a polyline or a polynomial interpolating the point masses, and in another embodiment as a sequence of discrete points, wherein the discrete points are located between the point masses or are congruent with at least a portion of the point masses.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
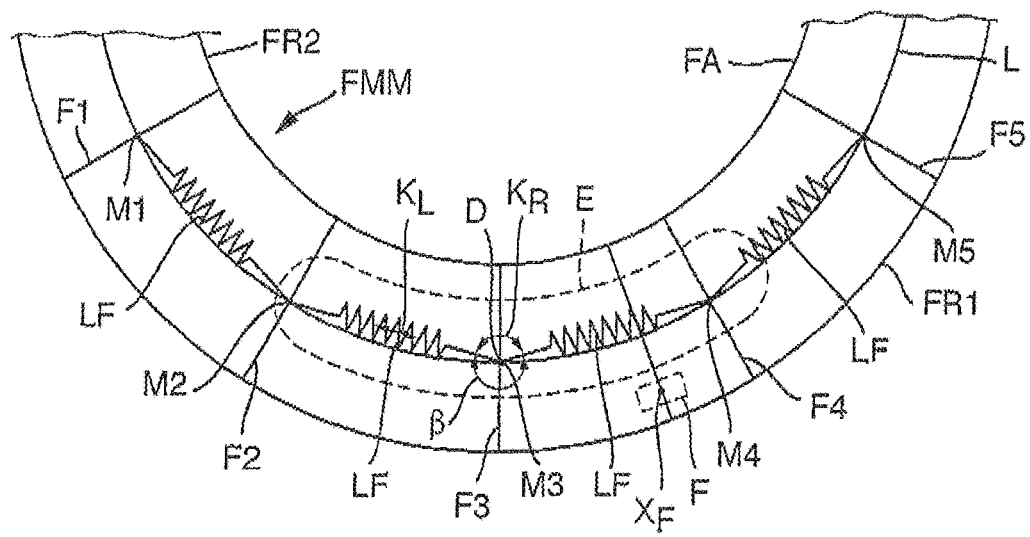
FIG. 1 shows a first schematic view of an embodiment of a spring-mass model.

The illustration in FIG. 1 shows a schematic view of a first embodiment according to the invention of a spring-mass model FMM. The spring-mass model FMM is located on a road FA, wherein the road FA has a first road edge FR1, a second road edge FR2, and a road center line L running centrally between the first road edge FR1 and the second road edge FR2.

The spring-mass model FMM has five point masses M1-M5. Each point mass M1-M5 is located on a guideway F1-F5 along which it can move. The guideways F1-F5 have predefined spacings from one another along the road center line L and each extend perpendicularly to the road center line L from the first road edge FR1 to the second road edge FR2, so that each of the point masses M1-M5 can move only within the road FA and only perpendicular to the road center line L.

Every pair of directly adjacent point masses M1-M5 is connected by a translational longitudinal spring element LF, wherein the translational longitudinal spring element LF exerts a spring force $K_L$ in the direction of a straight line that connects the two adjacent point masses M1-M5.

Every set of three directly sequential point masses M2-M4, which is to say a preceding point mass M2, a middle point mass M3, and a subsequent point mass M4, forms a unit E. The point masses M2-M4 of each unit E are connected by a rotational spring element RF (FIG. 2) with a spring force $K_R$ (FIG. 1) that exerts a torque. The rotational spring element RF has a center of rotation D that coincides in each case with a position of the middle point mass M3 of the unit E. The spring force $K_R$ of the rotational spring element RF is a function of an angle β (FIG. 1) between a first straight line and a second straight line (not shown), wherein the first straight line in each case connects a middle point mass M3 of the unit E with the preceding point mass M2 of the unit E, and the second straight line in each case connects the middle point mass M3 of the unit E with the subsequent point mass M4. The spring force $K_R$ has a zero point for a value of the angle β of 180°.

A system of differential equations is established for the point masses M1-M5, wherein the spring-mass model FMM has no damping. The system of differential equations is solved for a rest state, wherein the rest state is distinguished by the fact that all point masses M1-M5 are at rest, which is to say have a speed $v_M=0$ and an acceleration $a_M=0$. The positions of the point masses, or of a portion of the point masses, resulting as solutions serve as data points of the desired trajectory S. The desired trajectory sought is a curve connecting the point masses or a portion of the point masses, in particular a polyline or a polynomial interpolating the point masses. The curve is stored either in the form of a continuous analytic expression or in the form of a sequence of discrete points, wherein the points are congruent with at least a portion of the point masses or are located between the point masses. In order to calculate the desired trajectory S of a vehicle F that is located at a position $x_F$ on the road FA, the guideways F1-F5 each have a predefined spacing from a straight line (FIG. 1) that passes through the position $x_F$ and is perpendicular to the road center line L. If the vehicle moves at a speed $v_F$, the spring-mass model FMM is moved with the vehicle F. For this purpose, the desired trajectory S is recalculated for a current position x+dx of the vehicle F at different times, for example at time intervals dt.

Figure 2:
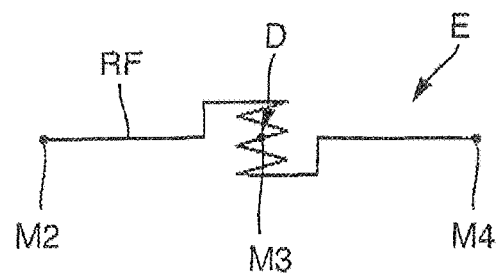
FIG. 2 shows a schematic view of a unit of three point masses of the spring-mass model from FIG. 1.
Figure 3:
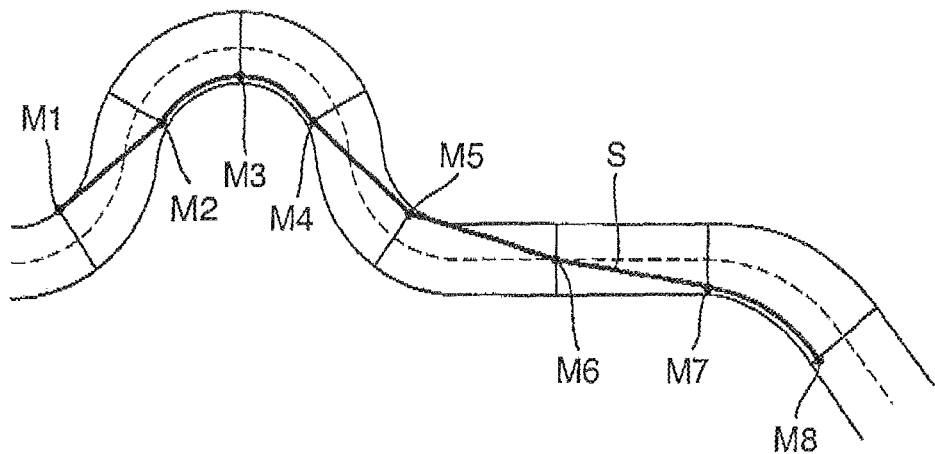
FIG. 3 shows a schematic view of a desired trajectory minimized with regard to distance.

An effect of the translational longitudinal spring elements LF of the spring-mass model FMM is sketched in FIG. 3. Shown are a desired trajectory S and point masses M1-M8 of a second spring-mass model that is reduced by the rotational spring elements RF and otherwise corresponds to the spring-mass model FMM from FIGS. 1 and 2. Spacings between the point masses M1-M8 are reduced as a result of the spring force $K_L$ of the translational longitudinal spring elements LF (not shown in FIG. 3). In this way, the translational longitudinal spring elements LF cause a minimization of the overall length of the desired trajectory S. A shape of the desired trajectory S in FIG. 3 is characterized by the "cutting" of curves.

Figure 4:
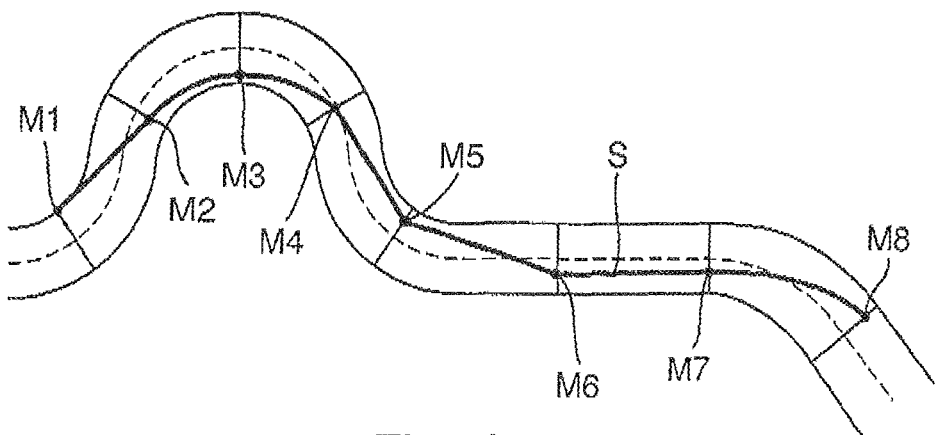
FIG. 4 shows a schematic view of a desired trajectory minimized with regard to curvature.

An effect of the rotational spring elements RF of the spring-mass model FMM is sketched in FIG. 4. Shown are a desired trajectory S and point masses M1-M8 of a third spring-mass model that is reduced by the translational longitudinal spring elements LF and otherwise corresponds to the spring-mass model FMM from FIGS. 1 and 2. A curvature of the desired trajectory S calculated for the third spring-mass model is minimized as a result of the spring force $K_R$ of the rotational spring elements RF. A curvature minimization of the desired trajectory S makes it possible for the vehicle F to travel the desired trajectory S at a high speed $v_F$.

A desired trajectory S optimized with regard to time is achieved through a weighting of distance minimization and curvature minimization. According to the invention, the weighting takes place by means of the spring forces $K_L$ of the translational longitudinal spring elements LF on the one hand and the spring force $K_R$ of the rotational spring elements RF on the other hand.

Figure 5:
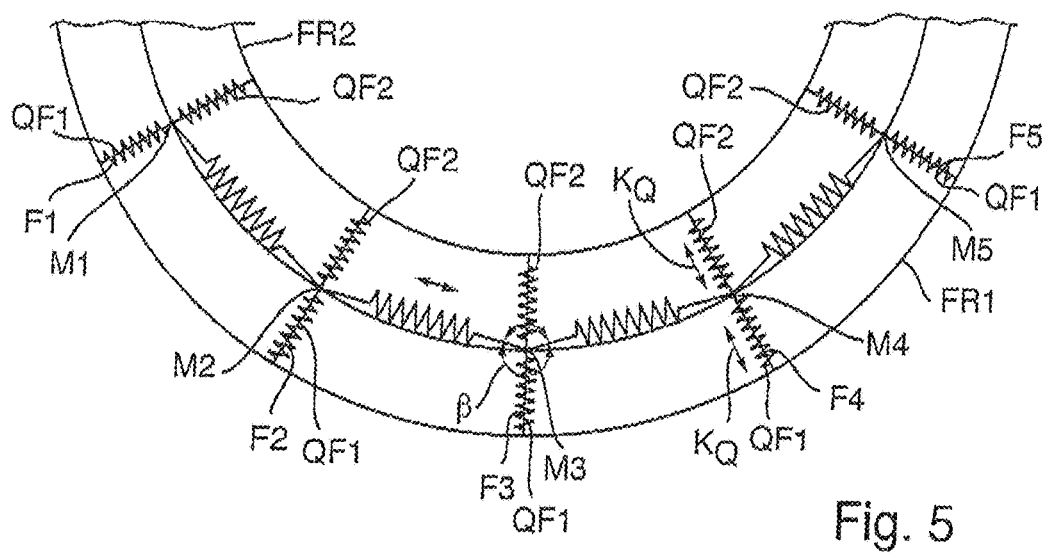
FIG. 5 shows a schematic view of an embodiment according to the invention of a spring-mass model.

Another embodiment of a spring-mass model FMM according to the invention is shown in the illustration in FIG. 5. Only the differences from the illustrations in FIGS. 1 and 2 are explained below. In order to ensure a spacing of a desired trajectory S from the road edges FR1, FR2, each point mass M1-M5 is connected to the first road edge FR1 by a first translational transverse spring QF1 and to the road edge FR2 by a second translational transverse spring QF2. The transverse springs QF1, QF2 each have a spring force $K_Q$ that acts perpendicular to the road center line L and thus parallel to the applicable guideway F1-F5.

Figure 6:
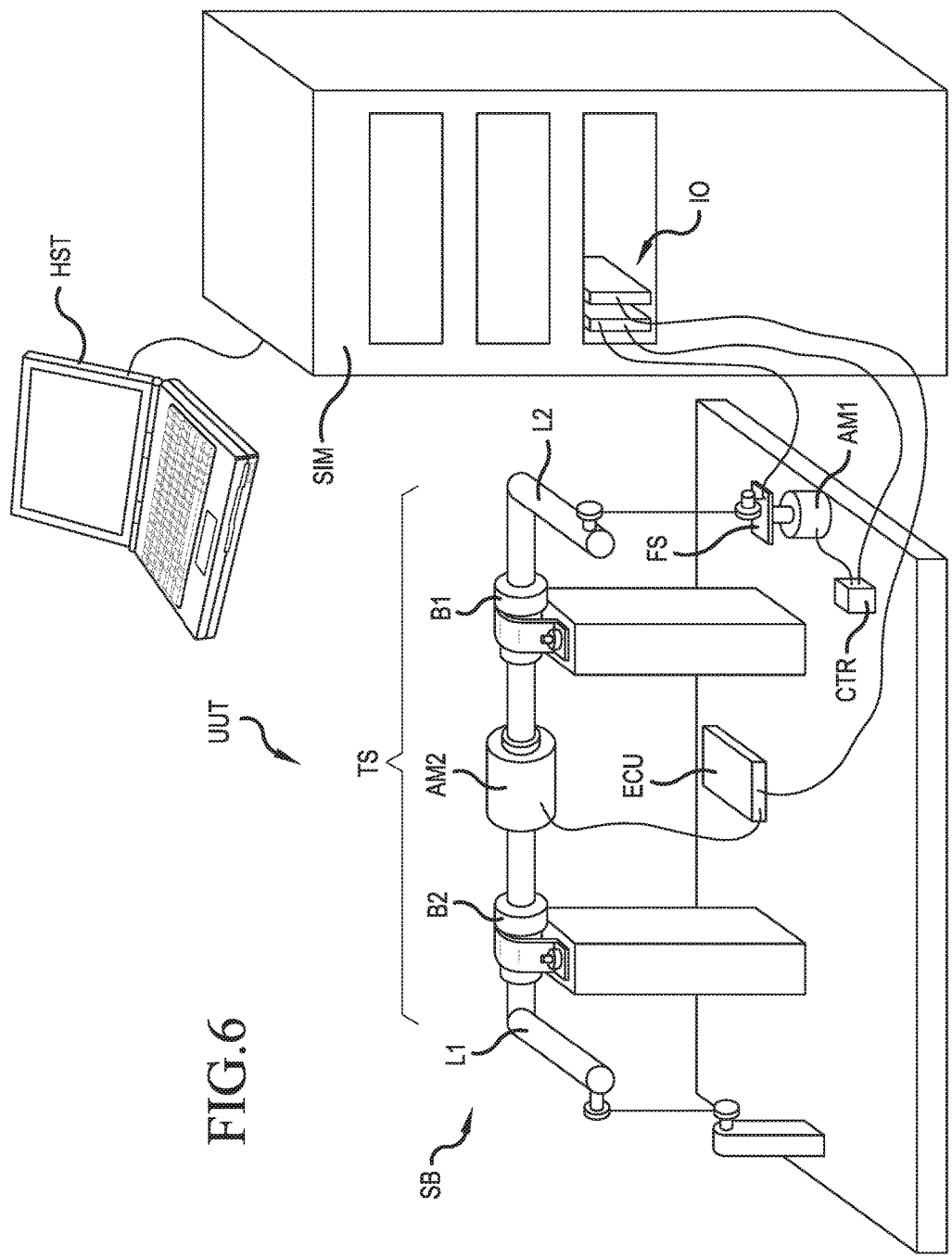
FIG. 6 shows an active stabilizer test bed for implementation of the spring-mass model simulation.

FIG. 6 is a Hardware-in-the-Loop simulator (SIM) with a unit under test (UUT), whereby the above exemplary embodiments of the spring-mass model can be utilized. The unit under test (UUT) can be an active stabilizer bar (SB), mounted on a floor plate, and an Electronic Control Unit (ECU). A stabilizer bar (SB) is a torsion spring (TS) mounted along a wheel axle of a vehicle to counteract body roll of the vehicle. The stabilizer bar is suspended from the vehicle's body by means of two pivot bearings B1 and B2, while lever arms L1 and L2 of the stabilizer bar (SB) are connected to the vehicle suspension for the wheels.

The Hardware-in-the-Loop simulator (SIM) tests an active stabilizer bar (SB) and the corresponding control unit for the stabilizer bar (SB). Simulator (SIM) includes a processor running a software model. The software model simulating an environment for the unit under test (UUT), i.e. the stabilizer bar and the control unit. The software model includes a physical simulation of a vehicle, wherein body roll is taken into account, and a virtual road network (FIG. 10) the vehicle is driving on. The simulator (SIM) includes a number of I/O boards (IO) arranging data exchange between the simulator (SIM) and the unit under test (UUT). The software model includes various simulations of sensors whose values are, via the I/O units, delivered to the control unit (ECU) for evaluation, e.g. a steering angle sensor, a wheel speed sensor, or a roll angle sensor.

A first electric motor (AM1) is mounted on the floor plate and is arranged to deflect one lever arm L2. The simulator (SIM) controls the first electric motor by means of a motor controller (CTR). From the state of the simulated vehicle the simulator calculates a deflection angle of the stabilizer bar and, by means of the first electric motor (AM1), deflects the stabilizer bar (SB) according to the calculated deflection angle. Concurrently, simulated sensor values are provided to the control unit (ECU) so the control unit (ECU) can activate a second motor (AM2) of the active stabilizer (SB), if necessary. A force sensor (FS) mounted on the first electric motor (AM1) measures feedback torque of the stabilizer bar and provides the measured torque to the simulator processor. The feedback torque is taken into account when the processor calculates a new state of the simulated car, in particular a new deflection angle, in the following time step.

When the vehicle is driving a curved lane and starts tilting the stabilizer bar (SB) deflects, resulting in a torque that counteracts the tilting, thus improving driving stability. Some vehicles comprise active stabilizer bars with a second electric motor (AM2) to support the mechanical torsion spring, wherein a control unit (ECU) is set up to recognize dangerous situations and activate the second electric motor (AM2) on demand.

The software model is in a closed loop with the physical unit under test (UUT), working on a physical environment and itself being influenced from that environment. Simulator (SIM) is also coupled to a host computer (HST) from which the software model is downloaded to the simulator (SIM). The host computer (HST) also runs control software to start and stop the simulation and to influence quantities in the software model at runtime. In particular, the control software is used to define driving maneuvers for the simulated vehicle.

A hardware-in-the-loop simulation typically precedes a field test of the unit under test (UUT), it has to fulfill these two requirements: It has to provide for realistic input to the unit under test (UUT) in order to stimulate a realistic response, and the data input must be provided in hard real-time since the unit under test (UUT) is a prototype system intended to work in a real vehicle. Also, it is common to test the response of the unit under test (UUT) not only to usual driving situation, but also to extreme situations. Furthermore, the unit under test (UUT) can be a stabilizer bar (SB), traction control, anti-lock braking, transmission, etc. each wired to the IO boards of the simulator (SIM).

Figure 7:
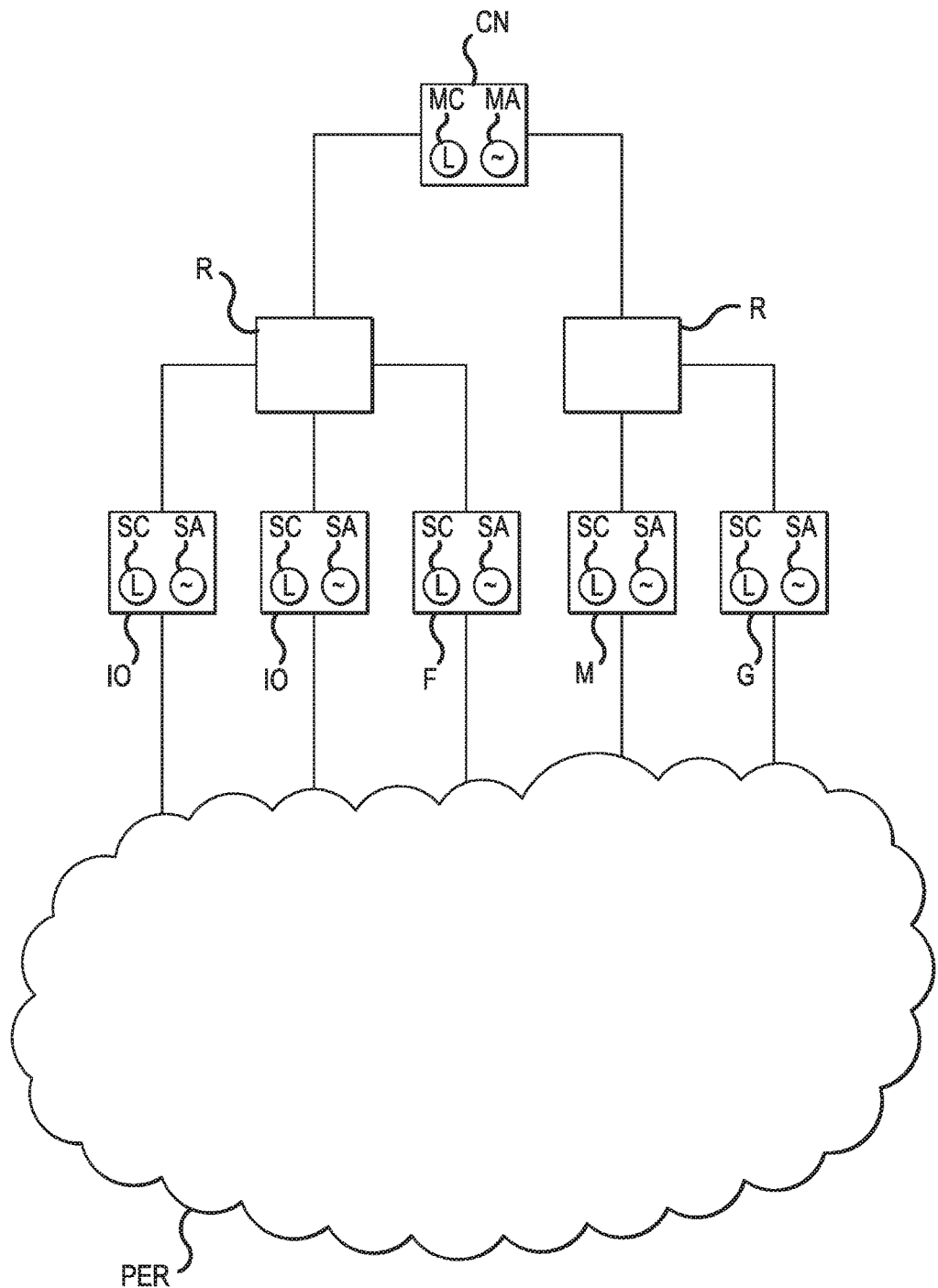
FIG. 7 shows a circuit schematic of an I/O system of the simulator of FIG. 6.
Figure 8:
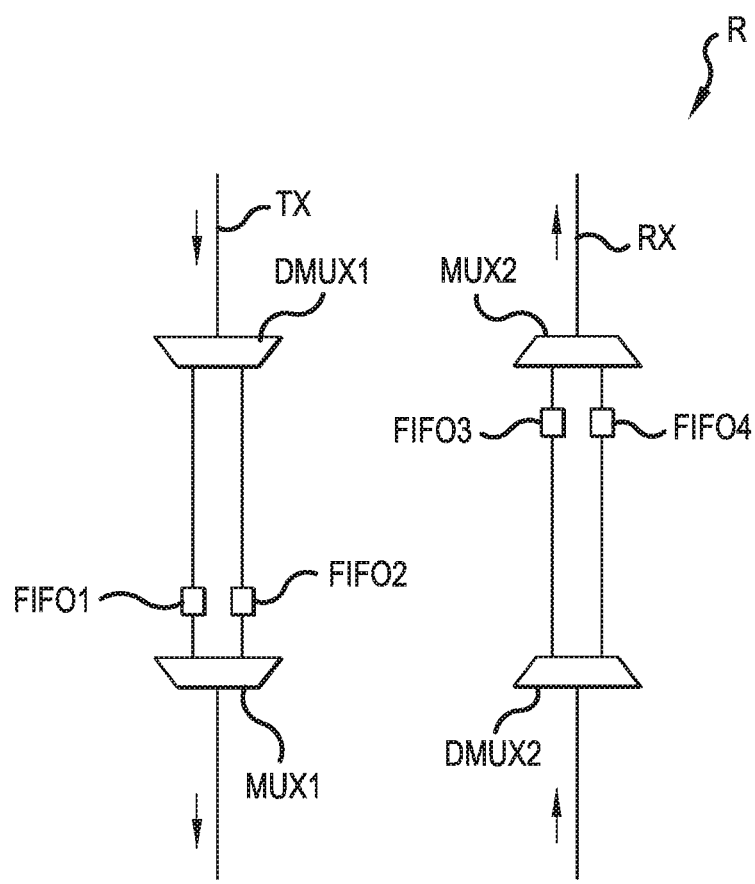
FIG. 8 shows a circuit schematic of a router of the I/O system.
Figure 9:
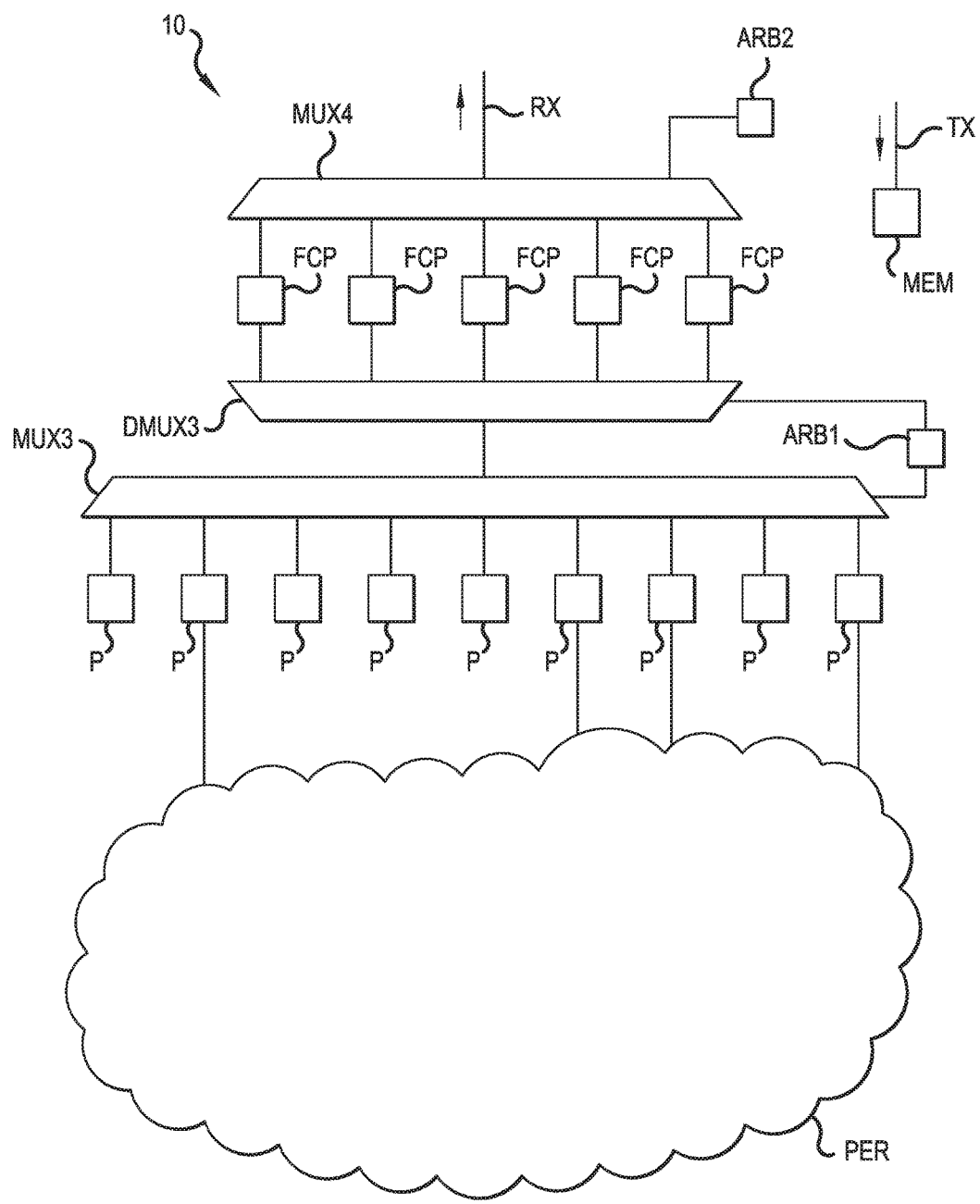
FIG. 9 shows a circuit schematic for a general purpose I/O board of the I/O system of FIG. 7.

FIGS. 7 to 9 depict the bus topology of an exemplary hardware-in-the-loop (HIL) simulator. The following description of figures explains how the hardware topology of the depicted bus is adapted to the real-time requirements of HIL simulators. In general, HIL style real-time systems have to fulfil the following requirements. Low latency, where data exchange between the software model running on the processor and the HIL peripherals is rapid enough to ensure the processed I/O data is up to date. Low jitter, such that hard real-time (<=1 ms) completion of a software cycle within a predefined time frame (1 ms in a typical automotive HIL scenario) is guaranteed. Hence, processing time for real-time relevant routines must be predictable. Large fluctuations in processing time are not acceptable. Fast synchronization, such that measurements, i.e. data read-ins from physical sensors, may trigger updates in the software model. Latency of the trigger signal should be as low as possible to make sure the measured sensor value corresponds to the time it is demanded. Also, signals that are processed by several, spatially separated components of the HIL simulator must be instantaneously accessible within the entire system.

FIG. 7 shows the overall topology of the I/O system. A master CPU CN running the software model is a master processor of the entire bus. The master CPU (CN) is connected to a number of routers (R), and each router is connected to a number of slide-in I/O boards (IO) as shown in FIG. 6. The I/O boards (IO) provide data links between the CN and the peripherals (PER) of the HIL simulator. Also, the spring-mass models can be provided as FPGAs or dedicated circuits within the simulator. With respect to FIG. 6, the peripherals (PER) are the ECU, the force sensor FS, and the motor controller CTR. The I/O boards of the I/O system shown are two general purpose I/O boards (IO), an FPGA board (F) with a user programmable FPGA supporting the node (CN), a signal measurement board (M) for measuring control unit (ECU) output signals or sensors, and a signal generation board (G) for simulating control unit (ECU) input signals. The signal generation board has on-board circuitry to simulate various sensor signals.

The exemplary bus is a serial point-to-point network, where the connection between two nodes includes two physical one-way data lines: an uplink line RX for data flowing upstream, i.e. towards the master CPU (CN), and a downlink line for data flowing downstream, i.e. towards the I/O boards (IO). Each physical data line comprises two logical data channels, wherein one logical channel is reserved for highly prioritized signals, in particular trigger signals and synchronization signals.

To synchronize master CPU and I/O boards (IO), and ensure both are working on the same time base, the master CPU (CN) includes a master clock (MC) whose clock signal is available on the entire bus as a highly prioritized signal. Each I/O board comprises a slave clock (SC) that synchronizes continuously with the master clock (MC).

The master CPU (CN) also comprises a master angle clock (MA) providing an angle signal that defines an angular position of rotating components in the software model, e.g. a camshaft or a crankshaft. As with the time signal the angle signal is highly prioritized and available on the entire bus since an angular position may be processed on several, spatially separated components of the HIL simulator. That is, some I/O boards include on-board circuitry to simulate camshaft or crankshaft signals, and that circuitry should work on the same angle base as the software model. Each I/O board (or at least some of them) comprises a slave angle clock (SA) that synchronizes continuously with the master angle clock.

FIG. 8 depicts the inner structure on an exemplary router (R). In the router (R) all data pass through an FPGA. In the FPGA, an intelligent demultiplexer DMUX1 routes all highly prioritized data packets from the downlink line TX into a first FIFO (FIFO1) and all other data packets into a second FIFO (FIFO2). An intelligent multiplexer MUX1 empties the FIFOs and reroutes the data packets onto the downlink line TX. MUX1 gives FIFO1 priority, i.e. FIFO2 is ignored unless FIFO1 is empty. Upstream data is treated similarly with DMUX2 sending priority packets to FIFO3 and other packets to FIFO4 for multiplexing via MUX2 into the uplink line (RX). Thus, routers (R) provide hard-wired "overtake lanes" for trigger signals, clock signals and angular clock signals. The figure is simplified in that it only depicts one downlink line (TX) and one uplink line (RX), whereas the routers actually comprise multiple downlinks (see FIG. 3). In addition, the routers (R) include routing logic for routing a downlink data packet onto the desired downlink line.

FIG. 9 depicts the inner structure of general purpose I/O board IO. A more detailed description of the general purpose I/O board (IO) is provided in co-owned U.S. application Ser. No. 15/151,767, the disclosure of which is incorporated herein by reference.

The I/O board comprises a number of user programmable flow control processors (FCPs) for preprocessing (and post-processing, respectively) and transferring I/O data in parallel. The I/O board also comprises a number of data ports P, wherein each port may be connected to a peripheral device by a user. Each flow control processor (FCP) may access the data ports via a third multiplexer MUX3 and a third demultiplexer DMUX3, both controlled by means of a first arbiter ARB1. Only one FCP at a time can access the data ports, and each FCP must request access from first arbiter ARB1. On the first arbiter ARB1, a priority for each (programmed) FCP is saved, according to a priority of the software model task the FCP in question is associated with. If two or more FCPs have requested access at the same time the FCP with the highest priority gains access first.

Accordingly, a second arbiter ARB2 controls access of the flow control processors (FCPs) to the uplink line RX via a fourth multiplexer MUX4. The flow control processors (FCPs) must request access to uplink line RX from the second arbiter, and second arbiter grants access to uplink line RX according to the individual FCP priority. Output data arriving on the downlink line TX is saved in a memory MEM accessible by each FCP at will. The hardware topology of the general purpose I/O board (IO) improves real-time capability in that jitter is kept low since preprocessing of I/O data for different tasks and postprocessing of I/O data from different tasks, respectively, is done in parallel, so no process is halted in favor of a more important process. Also, latency is kept low since real-time relevant processes are preferred.

Figure 10:
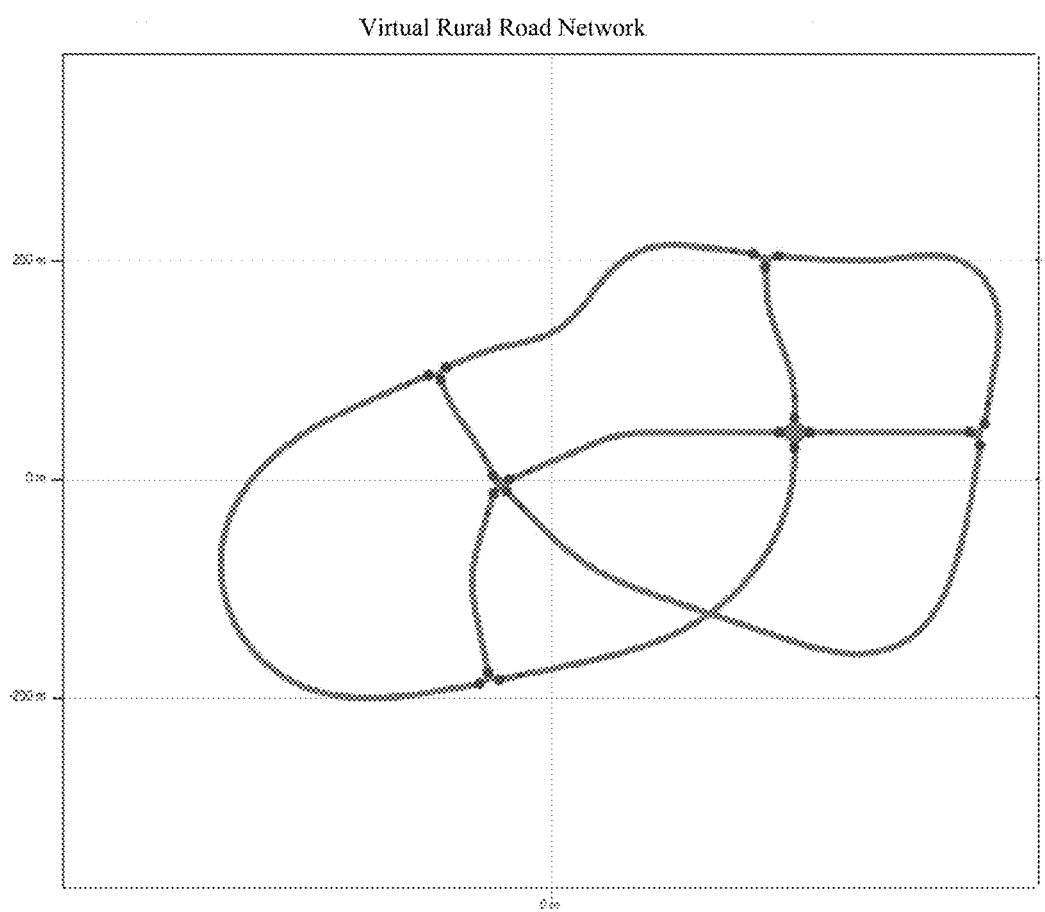
FIG. 10 shows a virtual track network of the simulator.

Users of the unit under test (UUT) will expect the vehicle system capabilities to include complex traffic scenarios that feature road networks with numerous junctions. FIG. 10 shows an exemplary virtual network of roads for testing of the unit under test (UUT) allowing for large numbers of possible driving routes. With the simulator system it is even possible to simulate test drives over hundreds of kilometers, wherein the route is extracted from real-world digital maps, e.g. GOOGLE Maps. As noted above, it is common to interfere with the simulation from outside at runtime via the host computer (HST) to change the vehicle route on the fly, for example.

The spring-mass model is a method to calculate a local corner-cutting path for a virtual vehicle at runtime in real-time. Since the path is calculated anew within each time step it can be manipulated at will at runtime of the model and without stopping the simulated vehicle. At the same time the additional processor load is negligible. Since the shape of the road around the vehicle changes minimally between two simulation time steps, a small number of iterations is necessary to calculate a new path (only one iteration usually), so real-time capability of the software model is preserved. In short, the spring-mass model makes it possible to model realistic driving behavior while following the real-time requirements of a typical HIL simulation.

The vehicle's route may be changed at runtime in several ways, by user input via the control software running on the host PC; and by means of an automation algorithm running on the host PC. Such automation algorithms are common in the context of HIL simulations. One reason is that HIL time is highly demanded among engineers. A HIL simulation can run continuously if the process of altering the simulation and restarting it is automated. In addition, changes can be made by an autonomous external device, possibly a unit under test (UUT), e.g. a navigation system receiving simulated GPS data from the software model. All these ways have in common that the input is provided from the outside and therefore, from the point of view of the software model, comes unexpectedly.

Furthermore, the spring-mass model method allows for the definition of different driver types. It is based on a spring-mass model tied to the simulated vehicle, and by weighting the spring constants one may model, for example: a careful driver seeking to follow his lane exactly, an aggressive driver cutting corners wildly, and a professional race driver seeking to follow an ideal, time-minimized path, or any driver behavior. Again, the driver type may be shifted at runtime by means of user input or an automation algorithm, so the stabilizer bar (SB) and its control unit (UUT) is tested under various realistic driving conditions.

Of course the stabilizer bar depicted in FIG. 6 is exemplary. All the explanations above are applicable to any unit under test (UUT) where centrifugal force on the vehicle, modeled by the spring-mass model, is important. For example, the unit under test (UUT) can also be an Electronic Stability Control (ESC) system, a traction control system, an anti-lock braking system, or a throttle control.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for calculating a desired trajectory for a vehicle, the vehicle being located at a position on a road bounded by two road edges, the road edges being known at least in a region around the position of the vehicle, the method comprising:
introducing a spring-mass model, the spring-mass model comprising:
at least three point masses that have a position on the road, the positions of the point masses representing data points of the desired trajectory, each point mass being movable along a guideway, each guideway being perpendicular to a road center line running centered between the road edges and extending from one road edge to the other road edge; and
translation longitudinal spring elements connecting the at least three point masses, the translation longitudinal spring elements having an attractive spring force acting in a direction that connects two point masses, every set of three directly sequential point masses forms a unit having a preceding point mass, a middle point mass, and a subsequent point mass;
positioning the guideways with predefined spacings from one another along the road center line, the guideways each having a predefined spacing along the road center line from a straight line that passes through the position of the vehicle and is perpendicular to the road center line;
connecting the point masses of each unit by a rotational longitudinal spring element with a spring force that exerts a torque, a center of rotation of the rotational spring element coinciding with a position of the middle point mass, the spring force of the rotational spring element being a function of an angle between a first straight line connecting the middle point mass with a preceding point mass and a second straight line connecting the middle point mass with a subsequent point mass and has a zero point for a value of the angle of 180°, the spring-mass model having a rest state at a speed $v_M=0$ and an acceleration $a_M=0$ for all point masses;
calculating the desired trajectory via the spring-mass model;
calculating the positions of the point masses for the rest state of the spring-mass model; and using the calculated positions of at least a portion of the point masses as data points for a calculation of a curve connecting the point masses, the curve representing the desired trajectory.

2. The method according to claim 1, wherein for a moving vehicle a position of the vehicle is determined at different times and the desired trajectory is calculated each time.

3. The method according to claim 2, wherein the position of the vehicle s determined at time intervals less than or equal to 1 ms and the desired trajectory is calculated each time.

4. The method according to claim 2, wherein positions of the point masses calculated at a first time are used as initial values for calculating positions of the point masses at a second time.

5. The method according to claim 1, wherein a portion or a majority of the point masses are located ahead of the position of the vehicle with regard to a direction of travel, and wherein the rest of the point masses are located behind the position of the vehicle with regard to the direction of travel.

6. The method according to claim 1, wherein the rest state of the spring-mass model is determined via a numerical method of root finding.

7. The method according to claim 1, wherein each point mass is connected to one of the road edges or to a line parallel to a road edge or to the road center line by at least one translational transverse spring element with a spring force acting perpendicularly to the road center line.

8. The method according to claim 1, wherein the spring force of the translational transverse spring element has a nonlinear characteristic curve.

9. The method according to claim 1, wherein the vehicle and the road are virtual.

10. The method according to claim 1, wherein the road edges are detected by a camera system or sensor.

11. The method according to claim 1, wherein the spacing between each pair of directly adjacent guideways along the road center line is a function of the speed of the vehicle.

12. The method according to claim 1, wherein the spring force of the translational longitudinal spring elements is inversely proportional to the spacing between two directly adjacent guideways of the vehicle.

13. The method according to claim 1, wherein the desired trajectory is calculated as part of a hardware-in-the-loop simulation.

14. The method according to claim 1, wherein the curve is defined either in the form of a continuous analytic expression, a polyline, a polynomial, or in the form of a sequence of discrete points.

* * * * *